United States Patent
Chan et al.

(10) Patent No.: US 6,610,580 B1
(45) Date of Patent: Aug. 26, 2003

(54) FLASH MEMORY ARRAY AND A METHOD AND SYSTEM OF FABRICATION THEREOF

(75) Inventors: Maria C. Chan, San Jose, CA (US); Hao Fang, Cupertino, CA (US); Mark S. Chang, Los Altos, CA (US); Mike Templeton, Atherton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/563,179

(22) Filed: May 2, 2000

(51) Int. Cl.[7] .............................................. H01L 21/76

(52) U.S. Cl. ..................... 438/424; 438/435; 438/439; 438/443; 438/444

(58) Field of Search ................................ 438/424, 207, 438/218, 219, 294, 221, 296, 352, 425, 427, 439, 297, 443, 444, 435, 257; 257/506, 507, 508, 509, 510

(56) References Cited

U.S. PATENT DOCUMENTS

| | | | | |
|---|---|---|---|---|
| 5,882,983 A | * | 3/1999 | Gardner et al. | 438/424 |
| 5,885,883 A | | 3/1999 | Park et al. | 438/435 |
| 6,008,112 A | | 12/1999 | Acocella et al. | 438/593 |
| 6,057,580 A | | 5/2000 | Watanabe et al. | 257/396 |
| 6,146,970 A | * | 11/2000 | Witek et al. | 438/424 |
| 6,153,482 A | * | 11/2000 | Su et al. | 438/297 |

FOREIGN PATENT DOCUMENTS

| | | |
|---|---|---|
| JP | 9213783 A | 8/1997 |
| WO | WO9719467 | 5/1997 |

* cited by examiner

Primary Examiner—Phat X. Cao
Assistant Examiner—Theresa T. Doan
(74) Attorney, Agent, or Firm—Winstead Sechrest & Minich P.C.; Robert A. Voigt, Jr.

(57) ABSTRACT

In a first aspect of the present invention, a flash memory array is disclosed. The flash memory array comprises a substrate comprising active regions, wherein the active regions are defined by a layer of nitride, the layer of nitride including a top surface. The flash memory array further comprises shallow trenches in the substrate, each of the shallow trenches including a layer of oxide, the layer of oxide having a top surface, wherein the top surface of the layer of oxide and the top surface of the layer of nitride are on substantially the same plane and channel areas wherein the occurrences of polyl stringers in the channel areas is substantially reduced. In a second aspect of the present invention, a method and system for fabricating a flash memory array is disclosed. The method comprises the steps of providing a layer of nitride over a substrate, forming trenches in the substrate and then growing a layer of oxide in the trenches. Finally, the layer of oxide is polished back. Through the use of the preferred embodiment of the present invention, a shallow trench isolation process is implemented as opposed to LOCOS process, thereby reducing the occurrence of polyl stringers in the channel area. Accordingly, the occurrence of unwanted electrical shorting paths between the adjacent regions is substantially reduced.

6 Claims, 6 Drawing Sheets

FLASH MEMORY ARRAY AND A METHOD AND SYSTEM OF FABRICATION THEREOF

FIELD OF INVENTION

The present invention relates generally to flash memory arrays and more specifically to a method and system for fabricating a flash memory array.

BACKGROUND OF THE INVENTION

Semiconductor manufacturers have increasingly turned to high density flash memory arrays in their integrated circuit design schemes. To achieve a high density integrated circuit, the transistors must be as small as possible. Typically, these high density flash memory integrated circuits utilize NAND-type gates as opposed to NOR-type gates since NAND gates have a considerably higher density than NOR gates. Smaller transistors allow more transistors to be placed on a single substrate, thereby allowing relatively large circuit systems to be incorporated on a single, relatively small die area.

When fabricating silicon integrated circuits, devices built onto the silicon must be isolated from one another so that these devices can be subsequently interconnected to create specific circuit configurations. From this perspective, it can be seen that isolation technology is one of the critical aspects of fabricating integrated circuits.

During the manufacturing of integrated circuit devices, the devices are isolated from one another through a combination of a thick field oxide (FOX) and channel doping. For advanced deep submicronmeter and high density flash memory technology, a duel field oxidation process, or LOCOS (LOCal Oxidation of Silicon), is usually required to optimize transistor isolation.

FIG. 1 is a flow chart illustrating the conventional process steps required to fabricate a NAND flash memory array. Also shown is a series of cross sectional views (FIGS. 1(a–g)) of a substrate showing the resulting structure.

The LOCOS process begins by thermally growing a layer of oxide on the surface of bare silicon, via step 10. Next, a nitride layer is provided over the layer of oxide, via step 12. This layer of nitride has a typical thickness in the range of around 1700 Angstroms. Then, the nitride layer is etched down to the oxide layer to define the active regions, via step 14. Next, using the nitride layer as a mask, a thin field oxide region (FOX) is grown between active regions using a thermal oxidation process, via step 16. Typically, the resulting step height 22 (see FIG. 1(d)) of the oxide region is between 1500 and 2500 Angstroms. Next, the nitride layer is stripped, via step 18. A layer of type-1 polysilicon (polyl) is then deposited, via step 20. Next, the polyl is etched down to the oxide region to define the channel area, via step 22.

When utilizing this process, channel misalignments have a tendency to occur. This is due primarily to the smaller spacings of the high density flash memory arrays. A channel misalignment occurs when the channel area is not defined directly in the middle of the FOX region. FIG. 2(a) illustrates a properly aligned channel area 24 and FIG. 2(b) illustrates a misaligned channel area 24'.

The etching process in step 22 is anisotropic, meaning that it removes material directionally to a predetermined depth. But due to the size of the step height of the FOX regions, along with the occurrences of channel misalignments, the etching process sometimes fails to remove all the polyl from the channel region, leaving a residue material which is called a poly 1 stringer. FIGS. 3(a–c) show the formation of polyl stringers after the polyl etch. The presence of polyl stringers can provide a contact between the two adjacent regions and failure to remove this material can lead to unwanted electrical shorting paths between the adjacent regions.

Utilizing the NOR technology, the polyl stringers are not a problem because steps that are implemented later in the NOR process (i.e. dipping steps, oxidation steps), effectively eliminate the polyl stringers. However, as previously mentioned, the NAND process is utilized for high density flash memory integrated circuits since NAND gates have a considerably higher density than NOR gates. Consequently, the NAND process does not incorporate later steps to effectively eliminate the polyl stringers.

Accordingly, what is needed is a method for reducing the occurrence of polyl stringers in the fabrication of flash memory arrays. The present invention addresses such a need.

SUMMARY OF THE INVENTION

In a first aspect of the present invention, a flash memory array is disclosed. The flash memory array comprises a substrate comprising active regions, wherein the active regions are defined by a layer of nitride, the layer of nitride including a top surface. The flash memory array further comprises shallow trenches in the substrate, each of the shallow trenches including a layer of oxide, the layer of oxide having a top surface, wherein the top surface of the layer of oxide and the top surface of the layer of nitride are on substantially the same plane and channel areas wherein the occurrences of polyl stringers in the channel areas is substantially reduced.

In a second aspect of the present invention, a method and system for fabricating a flash memory array is disclosed. The method comprises the steps of providing a layer of nitride over a substrate, forming trenches in the substrate and then growing a layer of oxide in the trenches. Finally, the layer of oxide is polished back.

Through the use of the preferred embodiment of the present invention, a shallow trench isolation process is implemented as opposed to LOCOS process, thereby reducing the occurrence of polyl stringers in the channel area. Accordingly, the occurrence of unwanted electrical shorting paths between the adjacent regions is substantially reduced.

DETAILED DESCRIPTION OF THE INVENTION

The present invention provides a method and system for fabricating a flash memory array. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

The method and system in accordance with the present invention is described in the context of a preferred embodiment. The preferred embodiment provides a method and system for fabricating a flash memory array wherein shallow trench isolation, rather than LOCOS, is used to provide field isolation structures.

Figure 1:
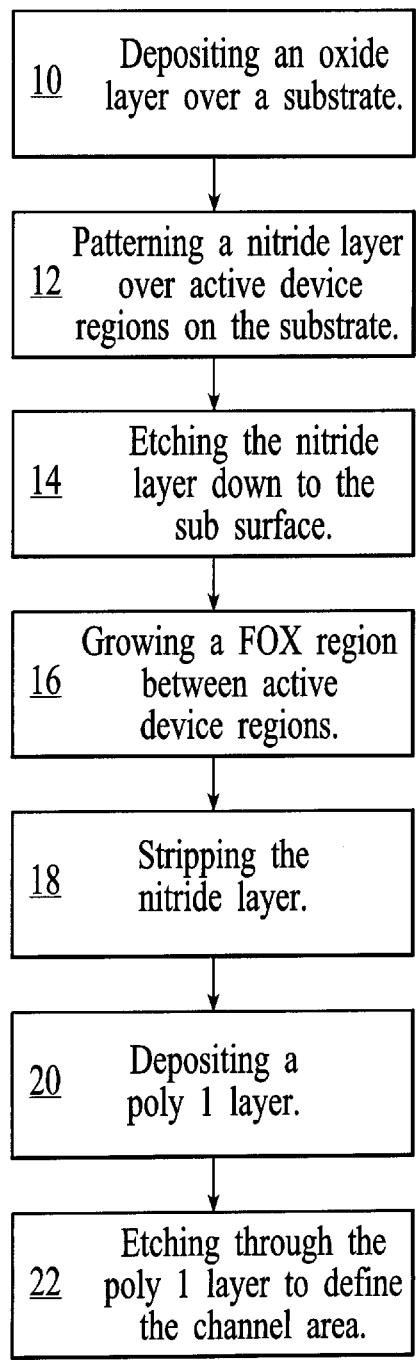
FIG. 1 is a flow chart illustrating the conventional process steps required to fabricate a NAND flash memory array along with a series of cross sectional views of a substrate showing the resulting structure.
Figure 1:
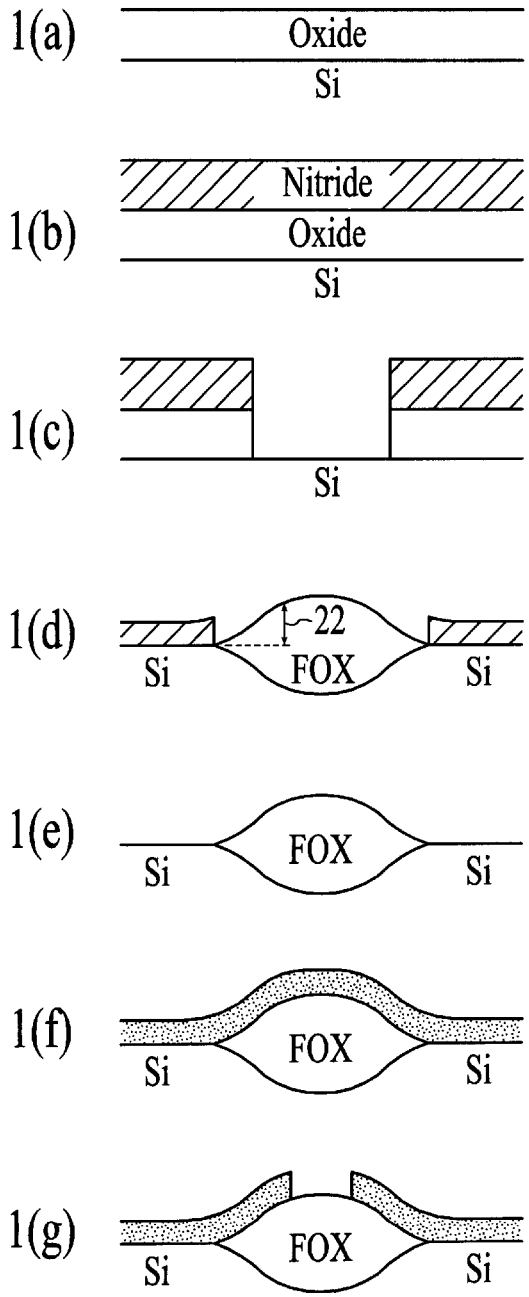
Figure 2A:
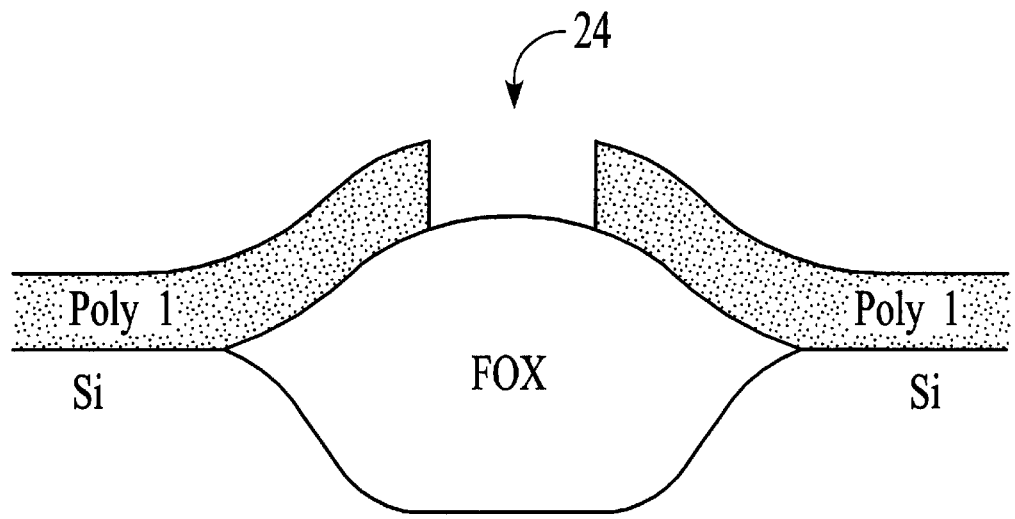
FIG. 2(a) illustrates a properly aligned channel area.
Figure 2B:
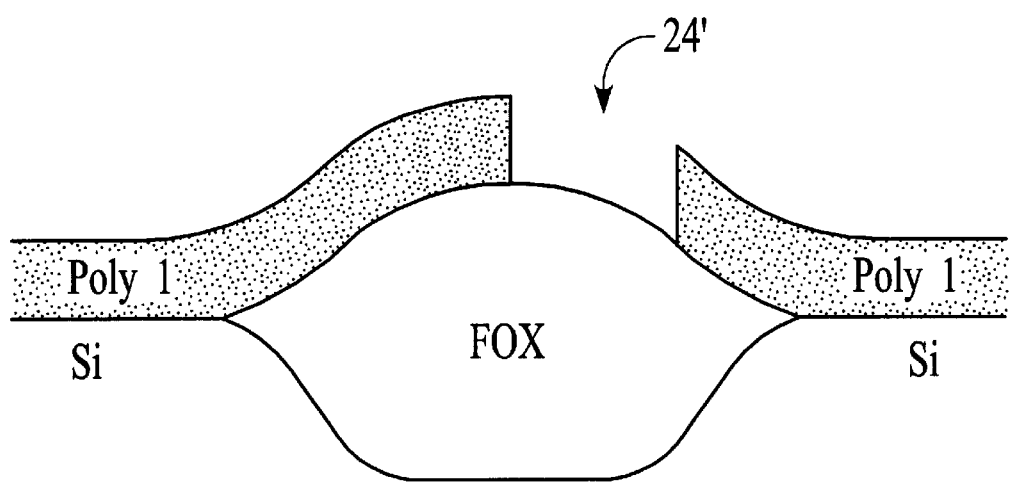
FIG. 2(b) illustrates a misaligned channel area.
Figure 3A:
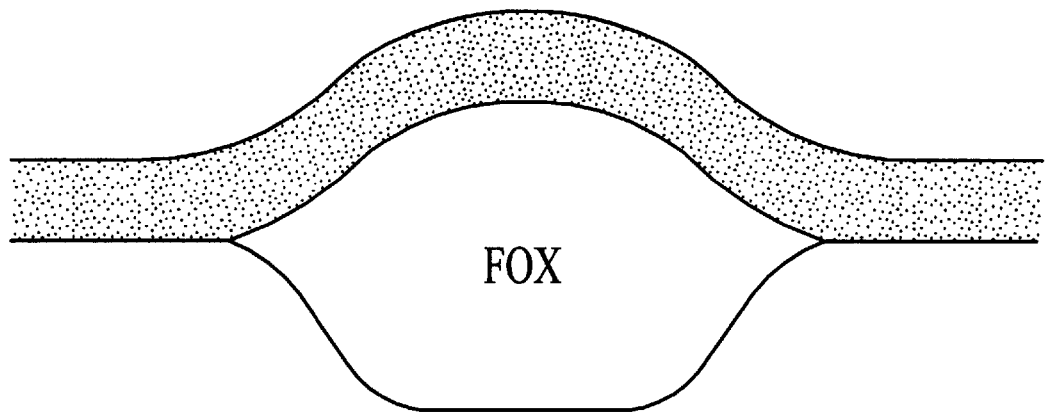
FIGS. 3(a–c) show the formation of polyl stringers.
Figure 3B:
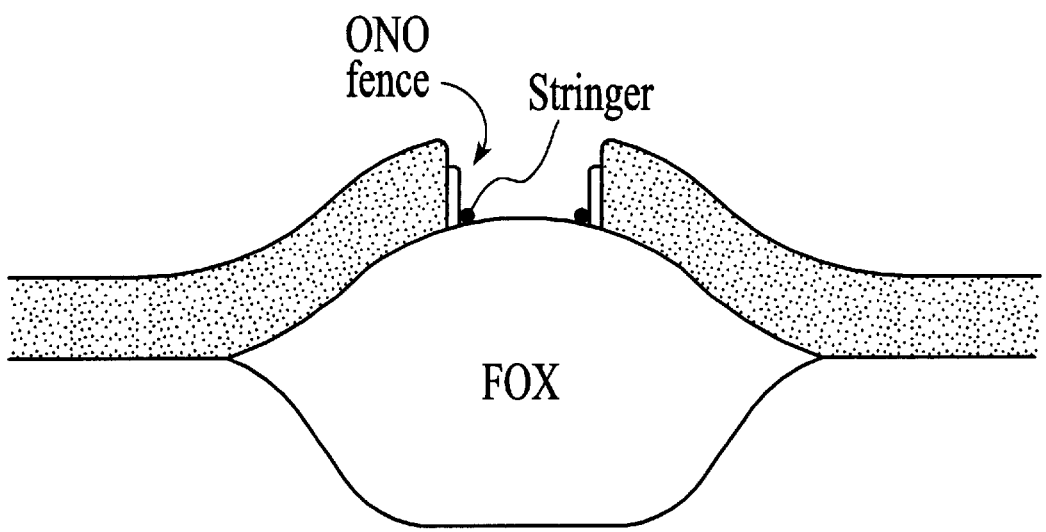
Figure 3C:
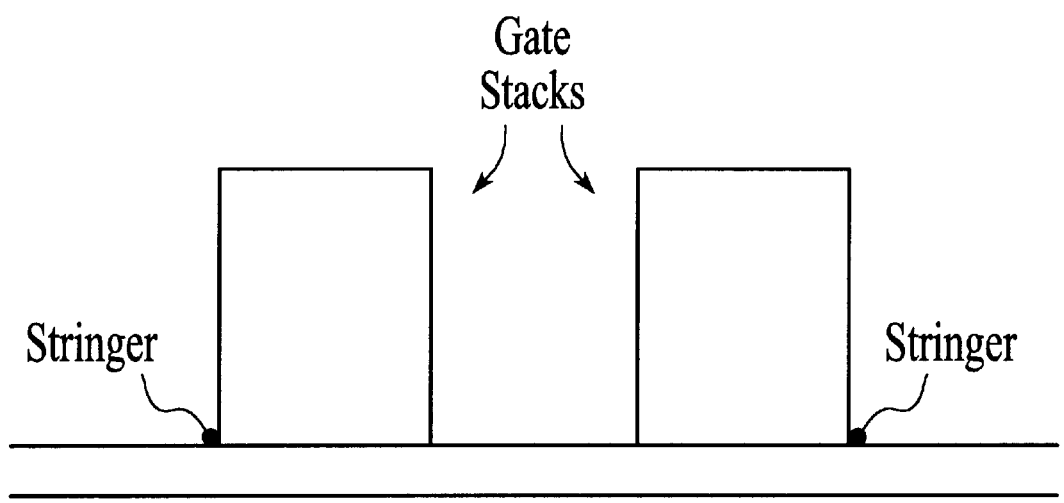
Figure 4:
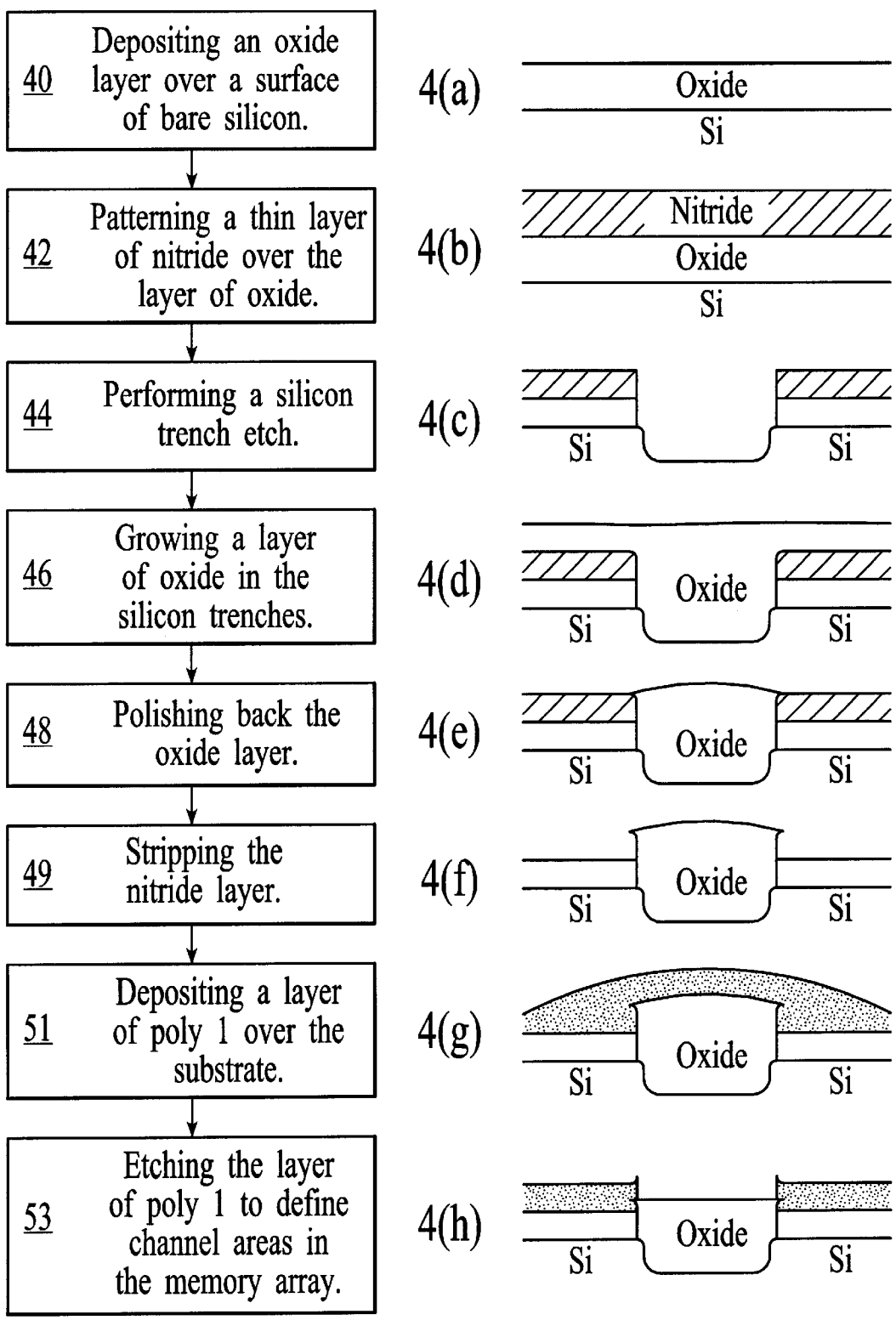
FIG. 4 is a flow chart illustrating the method steps for fabricating a NAND flash memory array in accordance with the preferred embodiment of the present invention along with a series of cross sectional views of a substrate showing the resulting structure.

FIG. 4 is a flow chart illustrating the method steps for fabricating a NAND flash memory array in accordance with the preferred embodiment of the present invention. Also shown is a series of cross sectional views (FIGS. 4(a–g)) of a substrate showing the resulting structure.

The method begins by depositing a layer of oxide over a surface of bare silicon, via step 40. Next, a thin layer of nitride is patterned over a substrate, via step 42. Preferably, this layer of nitride defines the active regions and has a height of approximately between 1400–1700 Angstroms. A silicon trench etch is then performed to form shallow trenches in the substrate in isolation locations, via step 44. Preferably, the shallow trenches are anisotropically etched into the substrate and are approximately 3000 Angstroms in depth. After the shallow trenches are formed, a layer of oxide is grown in the shallow trenches, via step 446. Preferably this oxide layer is approximately 6000 Angstoms thick.

Figure 5:
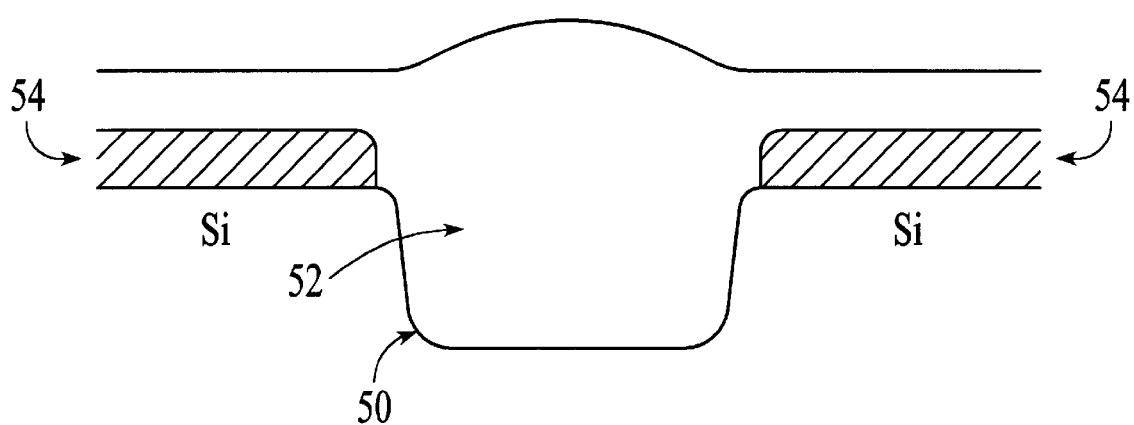
FIG. 5 is a cross-sectional view of the substrate showing an example of a trench isolation structure in accordance with the present invention.

Please refer now to FIG. 5. FIG. 5 is cross-sectional view of the substrate showing an example of a trench isolation structure in accordance with the present invention after step 46. A shallow trench 50 containing the oxide layer 52 is shown located between active regions, which are masked with nitride 54.

Figure 6:
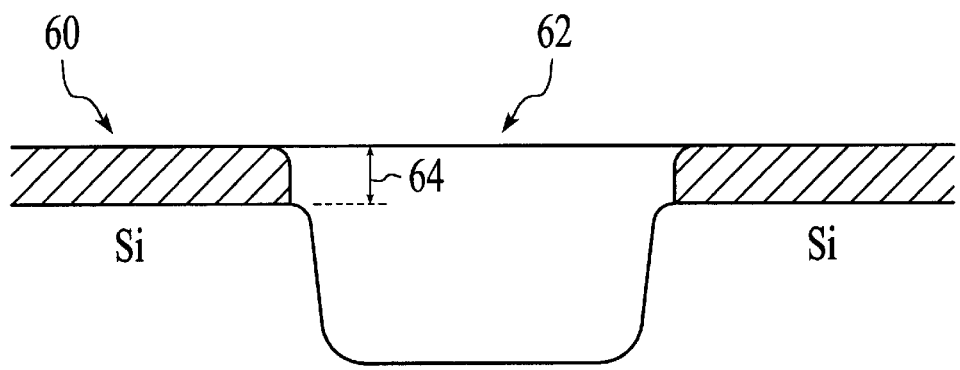
FIG. 6 is a cross-sectional view of the substrate showing the step height after the polishing of the oxide layer.

Referring back to FIG. 4, the oxide layer is then polished back, via step 48. This is done to planarize the oxide surface. Consequently, it is preferable that the top surface of the oxide layer and the top surface of the nitride layer are on substantially the same plane after step 48. FIG. 6 is cross-sectional view of the substrate after step 48 wherein the top surface of the nitride layer 60 and the top surface of the oxide layer 62 are on substantially the same plane. By polishing the oxide layer back to the nitride layer, the step height 64 is preferably between 300–900 Angstroms. This is significantly lower than the step height of the conventional process (1500–2500 Angstroms).

Again referring back to FIG. 4, the nitride layer is then stripped, via step 50. A layer of polyl is then deposited over the substrate, via step 52. Finally, the layer of polyl is etched to define channel areas in the memory array, via step 54. Based on the significant decrease in step height provided by utilizing the method in accordance with the present invention, the subsequent deposition and etching of polyl material results in a substantial decrease in the amount of polyl stringers left in the channel region due to channel misalignment. Accordingly, the occurrence of unwanted electrical shorting paths between the adjacent regions is substantially reduced.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for fabricating a memory array comprising the steps of:
   (a) patterning a layer of nitride to define active regions on a substrate;
   (b) performing a silicon etch to form a plurality of shallow trenches in the substrate;
   (c) growing a layer of shallow oxide in the plurality of trenches and over the nitride layer;
   (d) polishing back the layer of oxide wherein a top surface of the layer of oxide and a top surface of the layer of nitride are on substantially the same plane and wherein the oxide layer includes a step height wherein the step height is no greater than 900 Angstroms;
   (e) providing a layer of polyl over the substrate; and
   (f) etching the layer of polyl to define channel areas over the substrate wherein the occurrences of polyl stringers in the channel areas is substantially reduced.

2. A method for fabricating a memory array comprising the steps of:
   (a) providing a layer of nitride over a substrate;
   (b) forming a plurality of shallow trenches in the substrate;
   (c) growing a layer of oxide in the shallow trenches and over the layer of nitride layer;
   (d) polishing back the layer of oxide wherein a top surface of the layer of oxide and a top surface of the layer of nitride are on substantially the same plane;
   (e) providing a layer of polyl over the substrate; and
   (f) etching the layer of polyl to define channel areas in the memory array wherein the occurrences of polyl stringers in the channel areas is substantially reduced.

3. The method of claim 2 wherein step (a) further comprises:
   (a1) patterning the layer of nitride to define active regions on the substrate.

4. The method of claim 3 wherein step (b) further comprises:
   (b1) performing a silicon etch to form the trenches.

5. The method of claim 4 wherein the oxide layer includes a step height wherein the step height is no greater than 900 Angstroms.

6. The method of claim 5 wherein the step height is between 300 and 900 Angstroms.

* * * * *